United States Patent
Frediani et al.

(10) Patent No.: US 11,719,597 B2
(45) Date of Patent: Aug. 8, 2023

(54) MEASURING SYSTEM AND METHOD FOR MEASURING THE DISPLACEMENT OF AT LEAST ONE POINT OF A BRIDGE

(71) Applicant: MOVE S.R.L., Milan (IT)

(72) Inventors: Ferdinando Frediani, Lucca (IT); Gabriele Corsi, Sinalunga (IT)

(73) Assignee: MOVE S.R.L., Milan (IT)

( * ) Notice: Subject to any disclaimer, the term of this patent is extended or adjusted under 35 U.S.C. 154(b) by 284 days.

(21) Appl. No.: 17/055,336

(22) PCT Filed: May 27, 2019

(86) PCT No.: PCT/IB2019/054364
§ 371 (c)(1),
(2) Date: Nov. 13, 2020

(87) PCT Pub. No.: WO2019/229621
PCT Pub. Date: Dec. 5, 2019

(65) Prior Publication Data
US 2021/0208023 A1    Jul. 8, 2021

(30) Foreign Application Priority Data
May 28, 2018    (IT) .................... IT102018000005785

(51) Int. Cl.
*G01M 5/00* (2006.01)
*H03H 7/06* (2006.01)
*G01V 1/18* (2006.01)

(52) U.S. Cl.
CPC ............. *G01M 5/0008* (2013.01); *G01V 1/18* (2013.01); *H03H 7/06* (2013.01)

(58) Field of Classification Search
CPC ........ H03H 7/06; G01V 1/181; G01M 5/0008
USPC ................................................... 333/175, 185
See application file for complete search history.

(56) References Cited

FOREIGN PATENT DOCUMENTS

CN    104407385 A    3/2015

OTHER PUBLICATIONS

International Search Report dated Sep. 12, 2019 in PCT/IB2019/054364 filed on May 27, 2019.
(Continued)

*Primary Examiner* — Rakesh B Patel
(74) *Attorney, Agent, or Firm* — Oblon, McClelland, Maier & Neustadt, L.L.P.

(57) ABSTRACT

A measuring system for measuring the displacement of at least one point of a bridge, wherein the bridge has a resonance frequency included in the frequency band [fl, fh] where fl<fh, the measuring system including: a geophone adapted to be applied in the at least one point of the bridge, the geophone having a resonance frequency fr greater than fh and a frequency response for f<fh substantially equal to that of a double shunt; an analogue compensation device connected in series to the geophone and having a frequency response equal to that of a double integrator in the frequency band [fl, fh]; an analogue integrator device connected in series to the analogue compensation device; and an analogue/digital converter device connected in series to the analogue integrator device, the analogue/digital converter device being adapted to convert the output signal from the analogue integrator device into a digital signal.

8 Claims, 1 Drawing Sheet

(56) References Cited

OTHER PUBLICATIONS

Hakimitoroghi et al., "Compensation Techniques for Geophone Response Used as Vibration Sensor in Seismic Applications", 2017 Eleventh International Conference on Sensing Technology (ICST), IEEE, Dec. 4, 2017, 5 total pages, XP033325515.

Ion Sensor Nederland Bv: "LF-24 Low Frequency Velocity Sensor", Aug. 6, 2014, Retrieved from the Internet: URL:https://www.iongeo.com/content/documents/Resource%20Center/Brochures%20and%20Data%20Sheets/Data%20Sheets/Sensor%20Geophones/DS_SEN_121032LF24.pdf, 1 total page, XP055484031.

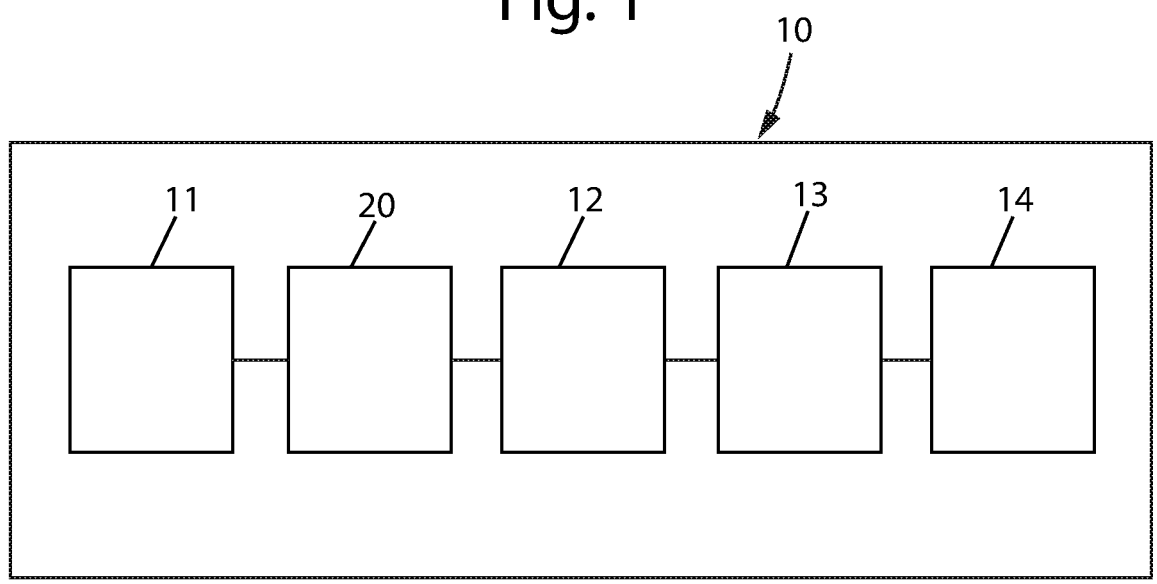
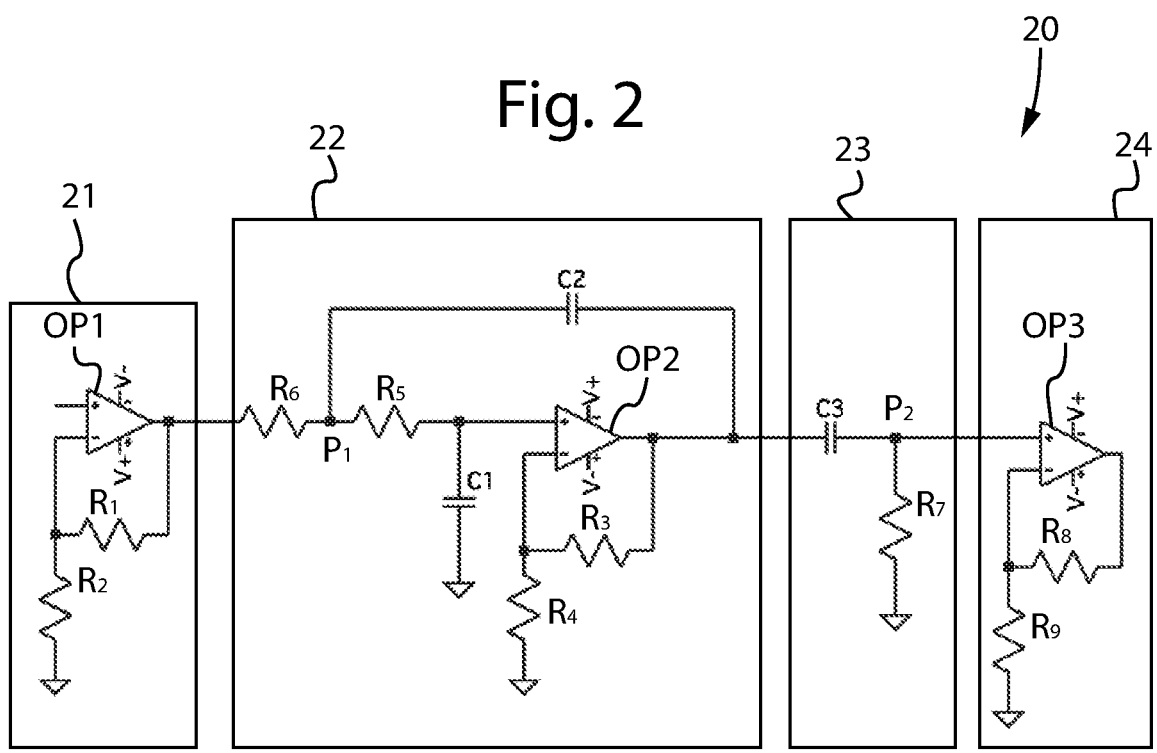

MEASURING SYSTEM AND METHOD FOR MEASURING THE DISPLACEMENT OF AT LEAST ONE POINT OF A BRIDGE

The present invention relates to a measuring system and a method for measuring the displacement of at least one point of a bridge, in particular of a point of at least one span of a bridge.

As is known, during the load tests on a bridge having one or more spans, it is necessary to measure the deformation to which the spans are subject in the load conditions provided by the design.

For that purpose, the displacements of at least one point of at least one of the spans of the bridge are measured directly or indirectly in the aforesaid load conditions. In direct measurements, in particular, the displacements of a point of the span with respect to a fixed reference point can be detected.

For direct measurements it is possible to use high power laser, which allows points even at a long distance with respect to the point whose displacements are to be detected to be used as reference points. This measurement technique requires the use of a sufficiently precise laser that generates such stable beams as to be able to perceive displacements even of a tenth of a millimetre. Lasers of such precision further require a good energy source. In virtue of these characteristics, lasers suitable for the aforesaid measurements are very expensive and therefore the use thereof is not very common.

Alternatively to high power laser, the so-called radar interferometer can be used.

The radar interferometer has a high complexity both from a hardware and software point of view, making the cost of the device so high that it can only be applied in some special cases in which there is a high budget available (e.g. in diamond quarries).

Furthermore, also this device has very high energy consumptions making it unsuitable to be left in proximity to a span for long periods.

In indirect measurements, quantities such as the acceleration or speed of a point of the span are measured and then, through an electronic system, numeric/analogue integrations are performed to have the measurement of the displacement of that same point.

For such measurements, it is very common to use accelerometric sensors with MEMs technology that are very cheap. As is known, the output voltage of an accelerometer is proportional to the acceleration, therefore in order to obtain the displacement, the output datum is integrated twice through an analogue or digital circuit. The problem of this type of measuring technique is that it only takes a small axis positioning error of the accelerometer to have a significant error in the measurement of the space due to the propagation of the error in the two integrations subsequent to the acceleration measurement. The error generated implies non-negligible uncertainty for measurement purposes.

Alternatively to accelerometric sensors, geophones can be used which, as it is known, are sensors that can detect the movement of the ground or seismic waves and transduce the detected signal into an electric pulse. The geophone is, in particular, a velocimetry sensor in which the transduced electrical signal is proportional to the speed at which the geophone itself moves. The geophone notoriously has a frequency response that can be likened to that of a second order high-pass filter. The geophone is characterized by a resonance frequency where the frequency response shows an overshoot upwards, for example positioned around 4 Hz. It is possible to reduce the overshoot around the resonance frequency by connecting a resistor in parallel to the geophone thus increasing the damping factor. In order to use geophones for indirect measurements of the displacements of one point of the span of a bridge, such geophones must necessarily have a frequency response as flat as possible in the oscillation frequency range of the bridge itself. For this purpose, compensated geophones are known which have a substantially flat frequency response also at frequencies lower than 4 Hz; these geophones, in particular, are compensated through a series of expensive digital filters that compensate the attenuation of the geophone itself at low frequencies until obtaining a substantially flat frequency response from about 0.1 Hz to 150 Hz. Alternatively to digital filters, in order to limit the costs of the geophone, analogue filters can be designed whose frequency response should necessarily be the exact inverse of that of the respective selected geophones. Therefore, they would be dedicated filters whose efficiency, however, depends on the tolerances of the geophones that can displace the resonance frequency with respect to the rated value. Therefore, it would be very complex and expensive to design analogue filters that consider the tolerances of the individual geophones.

The aim of the present invention is to overcome the drawbacks mentioned above and in particular to design a measuring system and a measuring method that allows an accurate indirect measurement of the displacement of at least one point of a span of a bridge to be performed and that is less expensive than known measuring systems. This and other objects according to the present invention are achieved by realising a measuring system and a measuring method as recited in claims 1 and 8.

Further features of the measuring system and measuring method are set forth in the dependent claims.

The features and advantages of the measuring system according to the present invention will be more apparent from the following description, which is to be understood as exemplifying and not limiting, with reference to the schematic attached drawings, wherein:

FIG. 1 is a block diagram of a measuring system according to the present invention;

FIG. 2 is a circuit diagram of the analogue compensation device included in the measuring system of FIG. 1.

With reference to the figures, a measuring system 10 is shown for measuring a displacement of at least one point of a bridge, in particular of a point of at least one span of a bridge.

The bridge is a mechanical system that has a resonance frequency comprised in the frequency band [fl, fh] where fl<fh, for example between fl=1 Hz and fh=20 Hz. In particular, generally, substantially all the spectral energy of the oscillation modes of the bridge is positioned around a main resonance frequency comprised between fl and fh.

The measuring system 10 comprises a geophone 11 adapted to be applied in a point of a bridge, in particular of at least one span of a bridge and to detect the oscillations of the bridge. In particular, the geophone 11 is able to detect the oscillations of the bridge to which it is applied and generates an electrical signal whose magnitude is proportional to the speed at which the bridge and therefore the geophone 11 are displaced by oscillating.

According to the present invention, such geophone 11 has a resonance frequency fr greater than fh and a frequency response substantially equal to that of a double shunt for frequencies f less than fh. This means that for f<fh the frequency response of the geophone 11 represented in a Bode diagram has a module that increases as the frequency increases according to a linear law with a slope of substantially 40 dB/decade and a substantially constant phase with the frequency and substantially equal to 180°.

The measuring system 10 further comprises an analogue compensation device 20 connected in series to the geophone 11 and having a frequency response substantially equal to that of a double integrator in the frequency band [fl, fh].

This means that in the frequency band [fl, fh] the frequency response of the analogue compensation device represented in a Bode diagram has a module that decreases as the frequency increases according to a linear law with a slope of substantially −40 dB/decade and a substantially constant phase with the frequency and substantially equal to −180°.

In this way the series of the geophone 11 and of the analogue compensation device 20 has a frequency response with a substantially constant module in the frequency band [fl, fh].

Preferably, the measuring system 10 further comprises an analogue integrator device 12 connected in series to the analogue compensation device 20; such analogue integrator device 12 is in particular adapted to integrate the electrical signal generated by the geophone 11 so as to provide an electrical signal whose magnitude is proportional to the displacement of the geophone 11. The electrical signal output by the analogue integrator device 12 is therefore representative of the displacement. Advantageously, the analogue integrator device 12 comprises a low-pass filter with cutoff frequency fti less than fl.

The measuring system 10 then comprises an analogue/digital converter device 13 connected in series to the analogue integrator device 12, where such analogue/digital converter device 13 is adapted to convert the electrical analogue signal at the output from the analogue integrator device 12 into a digital signal.

The analogue/digital converter device 13 is configured to sample the analogue electrical signal at a frequency fc>2fh to prevent any aliasing problems.

Advantageously, the measuring system 10 further comprises a processing unit 14, e.g. a microprocessor, connected to the output of the analogue/digital device 13 configured to interpolate the digital signal in order to obtain a curve that represents the displacement over time of the geophone 11 and therefore of the point of the bridge at which the geophone 11 is applied.

Preferably, the analogue compensation device 20, the analogue integrator device 12, the analogue/digital converter device 13 and the processing unit 14 are mounted on the same PCB (Printed Circuit Board) connected through cables to the geophone 11.

Preferably, the analogue compensation device 20 comprises:
 a first amplification stage 21;
 a double low-pass filter 22 connected in series to the first amplification stage and having a cutoff frequency ft not greater than fl.

In the event in which ft<fl, considering the Bode diagram of the double low-pass filter 22, it is certain that the frequency fl always rolls off on the straight line at −40 db/decade.

In the event in which ft=fl it is necessary to consider that at ft the real diagram of the filter diverges from the Asymptotic Bode diagram by about 3 dB therefore it is possible that possible magnitude distortions can arise in the response.

Preferably, the double low-pass filter 22 has a cutoff frequency ft less than fl.

In this way the aforesaid possible distortions can be prevented.

In addition to the first amplification stage 21 and the double low-pass filter 22, preferably, the analogue compensation device 20 further provides a high-pass filter 23 connected in series to the double low-pass filter 22 with a cutoff frequency fhp less than fl, in order to filter noise, e.g. the noise 1/f, white noise and offset noise.

In a first embodiment of the present invention, the first amplification stage 21 is a high-gain stage, e.g. about 70 dB. In that case, the double low-pass filter 22 is a passive filter.

In a second embodiment, the double low-pass filter 22 is an active filter that performs a second amplification stage.

In this case, the first amplification stage 21 has a lower gain with respect to that of the first embodiment;

In that way the possibility of the first amplification stage 21 operating in saturation mode is reduced. In fact, the presence of more than one amplification stage allows the amplification of the signal necessary for reaching a high signal noise ratio to be distributed through the various stages, at the same time preventing one or more amplification stages being able to operate in saturation mode.

Preferably, in this second embodiment the analogue compensation device 20 comprises a third amplification stage 24 downstream of the double low-pass filter 22 of the active type.

In particular, in the event in which the high-pass filter 23 is present, connected in series to the double low-pass filter 22 the third amplification stage 24 is connected in series to the high-pass filter 23; otherwise, in the absence of the high-pass filter 23 the third amplification stage 24 is connected in series to the double low-pass filter 22.

In any case, with three amplification stages a first amplification stage 21 can be provided with an even lower gain with respect to the case in which the third amplification stage 24 is not provided, thus further reducing the risks of the first amplification stage 21 operating in saturation mode.

Preferably, the active filter is of the Sallen Key cell type as illustrated in FIG. 2.

In particular, with reference to FIG. 2 the first amplification stage 21 is realized through a first operational amplifier OP1 in non-inverting configuration with a first resistance R1 placed between the output terminal and the inverting terminal of the first operational amplifier OP1, and a second resistance R2 placed between the inverting terminal and ground.

In series with the first amplification stage 21 there is the double low-pass filter realized through an active Sallen Key cell filter. In particular, such active Sallen Key cell filter has a second operational amplifier OP2 with a third resistance R3 placed between the output terminal and the inverting terminal of the second operational amplifier OP2, and a fourth resistance R4 placed between the inverting terminal and ground. Between the non-inverting terminal of the second operational amplifier OP2 and ground, a first compensator C1 is placed; a fifth resistance R5 is interposed between the non-inverting terminal and the first node P1. A sixth resistance R6 is interposed between the first node P1 and the output terminal of the first operational amplifier OP1; a second condenser C2 is interposed between the node P1 and the output terminal of the second operational amplifier OP2. The high-pass filter 23 is then connected to the output terminal of the second operational amplifier OP2 realized through a third condenser C3 and a seventh resistor R7. The third condenser C3 is interposed between the output terminal of the second operational amplifier OP2 and a second node P2; the seventh resistor R7 is interposed between the second node P2 and ground. The third amplification stage 24 is connected in series with the high-pass filter 23, realized through a third operational amplifier OP3 having the non-inverting terminal connected to the second node P2; then an eighth resistance R8 is provided, placed between the output terminal and the inverting terminal of the third operational amplifier OP3, and a ninth resistance R9 placed between the inverting terminal and ground.

The operational amplifiers OP1, OP2, OP3 are of the low current and offset voltage type.

The first amplification stage 21 has a gain G=1+R1/R2.

The first resistance R1 and the second resistance R2 are sized so that G is equal to about 28 dB. The third resistance R3, the fourth resistance R4, the eighth resistance R8 and the ninth resistance R9 are sized so that the overall gain of the analogue compensation device is about 70 dB.

Furthermore, the fifth resistance R5 and the sixth resistance R6 are selected so that R5=R6.

The first condenser C1 and the second condenser C2 are selected so that C1=C2.

The values of the sixth resistance R6 and of the second condenser C2 are, in particular, selected so that the double pole is at a frequency fp<fl where $$fp = \frac{1}{2\pi\sqrt{R2R1C2C1}} = \frac{1}{2\pi R2C2}.$$

The measuring system 10 according to the present invention allows indirect measurement of the displacement of at least one point of at least one span of a bridge in an accurate, simple and inexpensive way. In fact, the measuring system 10 uses a geophone whose compensation is not performed through expensive digital filters but by an analogue compensation device that does not provide compensation in the entire band of the geophone 10 but only in the frequency band [fl, fh] within which the resonance frequency of the bridge is comprised. This is possible thanks not only to the particular sizing of the analogue compensation device, but also to the choice of the particular geophone 10 with fr>fh and with a frequency response substantially equal to that of a double shunt for frequencies f less than fh. Should the analogue compensation device 20 compensate for the geophone 11 for its entire band, gain distortions would be introduced around the resonance frequency fr that would lead to inaccurate measurements. The measuring method, according to the present invention, is implemented through the use of the measuring system 10. Such measuring method is very simple as it provides applying the geophone 11 at a point of the span of a bridge and acquiring the data of the detections performed by the measuring system 10 that represent the displacements of the geophone 11 and therefore of the point of the bridge at which the geophone 11 is applied. The geophone 11 can then be easily moved to perform different measurements in different points of the bridge.

From the description provided, the characteristics of the measuring system for measuring the displacement of at least one point of at least one span of a bridge according to the present invention are clear, as are the related advantages.

Lastly, it is clear that the measuring system for measuring the displacement of at least one point of at least one span of a bridge thus conceived is susceptible to numerous modifications and variants, without departing from the scope of the invention; moreover, all details can be replaced with technically equivalent elements. In practice, the materials used, as well as the dimensions, can be of any type according to the technical requirements.

The invention claimed is:

1. A measuring system for measuring a displacement of at least one point of a bridge, the bridge having a resonance frequency comprised in a frequency band [fl, fh] where fl<fh, comprising:
   a geophone configured to be applied in the at least one point of the bridge, the geophone having a resonance frequency fr greater than fh and a frequency response for f<fh substantially equal to a frequency response of a double shunt;
   an analog compensation device connected in series to the geophone and having a frequency response equal to a frequency response of a double integrator in the frequency band [fl, fh], so that a series connection of the geophone and the analog compensation device has a frequency response with a substantially constant module in the frequency band [fl, fh];
   an analog integrator device connected in series to the analog compensation device; and
   an analog/digital converter device connected in series to the analog integrator device, the analog/digital converter device being configured to convert an output signal from the analog integrator device into a digital signal,
   wherein the analog compensation device comprises:
      a first amplification stage; and
      a double low-pass filter connected in series to the first amplification stage and having a cutoff frequency ft no greater than fl, the double low-pass filter being an active filter that comprises a second amplification stage.

2. The measuring system according to claim 1, wherein the double low-pass filter has a cutoff frequency ft less than fl.

3. The measuring system according to claim 1, wherein the analog compensation device further comprises a high-pass filter connected in series to the double low-pass filter with a cutoff frequency fhp less than fl.

4. The measuring system according to claim 1, wherein the analog compensation device comprises a third amplification stage downstream of the active filter.

5. The measuring system according to claim 1, wherein the active filter is of the Sallen Key cell-type.

6. The measuring system according to claim 1, wherein the analog integrator device comprises a low-pass filter with a cutoff frequency fti less than fl.

7. The measuring system according to claim 1, comprising a processing unit connected to an output of the analog/digital converter device configured to interpolate the digital signal for obtaining a curve representing geophone displacements over time.

8. A measuring method for measuring a displacement of at least one point of a bridge implemented by the measuring system according to claim 1, comprising:
   applying the geophone at a point of a span of the bridge; and
   acquiring data from detections performed by the measuring system which represent geophone displacements.

* * * * *